United States Patent [19]

Klein

[11] 4,350,026

[45] Sep. 21, 1982

[54] COOLING DEVICE FOR ELECTRICAL AND/OR ELECTRONIC COMPONENT ELEMENTS PRODUCING LOST HEAT AND A PROCEDURE FOR OPERATING SUCH

[75] Inventor: Erwin Klein, Heddesheim, Fed. Rep. of Germany

[73] Assignee: BBC Brown, Boveri & Company, Limited, Baden, Switzerland

[21] Appl. No.: 199,461

[22] PCT Filed: May 25, 1979

[86] PCT No.: PCT/CH79/00078

§ 371 Date: Apr. 28, 1980

§ 102(e) Date: Apr. 28, 1980

[87] PCT Pub. No.: WO80/00511

PCT Pub. Date: Mar. 20, 1980

[30] Foreign Application Priority Data

Aug. 26, 1978 [DE] Fed. Rep. of Germany ....... 2837353

[51] Int. Cl.³ ..................... F25D 17/00; H01L 23/44
[52] U.S. Cl. ................. 62/333; 165/104.25; 165/104.33; 357/82; 361/385
[58] Field of Search ............... 165/104.21, 104.33, 165/104.25, DIG. 12; 62/238.6, 332, 333; 357/82; 361/385

[56] References Cited

U.S. PATENT DOCUMENTS

| 3,371,298 | 2/1968 | Narbut | 165/104.33 X |
| 3,656,540 | 4/1972 | Henrici | |
| 3,818,983 | 6/1974 | Grandia | 165/104.21 X |

FOREIGN PATENT DOCUMENTS

| 2071964 | 9/1971 | France | |
| 2122413 | 9/1972 | France | |
| 832920 | 4/1960 | United Kingdom | 62/238.6 |

Primary Examiner—Albert W. Davis
Attorney, Agent, or Firm—Oblon, Fisher, Spivak, McClelland & Maier

[57] ABSTRACT

A cooling system for cooling at least one semiconductor component, including a convection heat exchanger thermally coupled to the component and a refrigeration cycle thermally coupled to the heat exchanger and including a compressor, a condenser, a collector, an expansion valve and an evaporator. The evaporator is coupled in series with the heat exchanger to form a coolant cycle for recooling of the coolant. At least one fan is provided for forcibly ventilating the convection heat exchanger. The condenser of the refrigeration cycle is installed in the heat exchanger whereby the fan serves also to cool the condenser. A coolant, in particular trifluortrichlorethane ($C_2F_3Cl_3$), having a boiling point below the wall temperature of the semiconductor component being cooled is used.

2 Claims, 1 Drawing Figure

U.S. Patent  Sep. 21, 1982  4,350,026
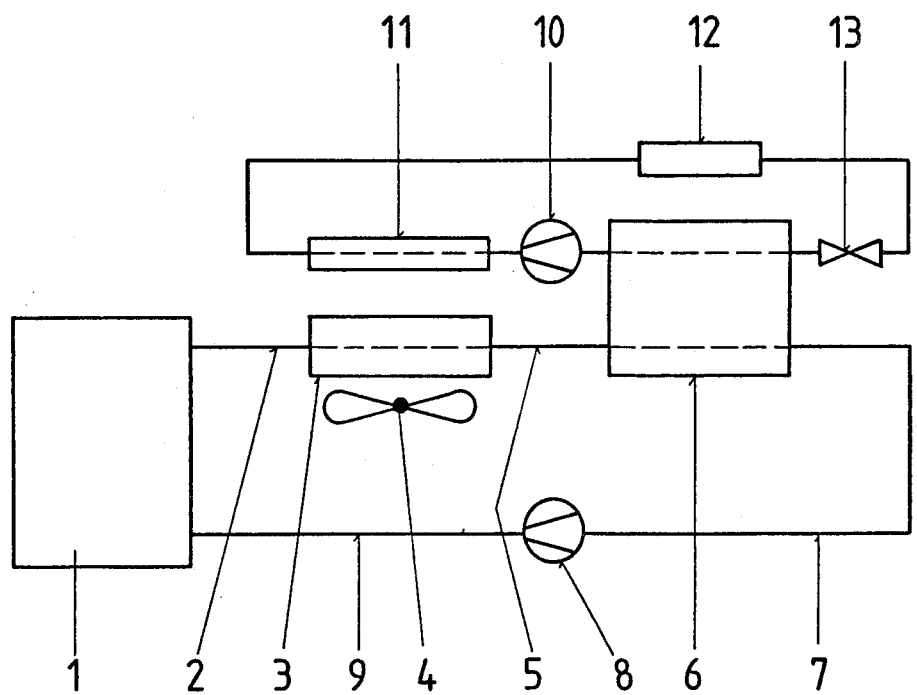

COOLING DEVICE FOR ELECTRICAL AND/OR ELECTRONIC COMPONENT ELEMENTS PRODUCING LOST HEAT AND A PROCEDURE FOR OPERATING SUCH

FIELD OF THE INVENTION

This invention refers to a cooling device for electrical and/or electronic component elements producing lost heat, in particular for electrical semiconductor component elements, with a coolant cycle in which there is a forced air ventilation thermal exchange mechanism for the recooling of the coolant.

This invention also refers to a procedure for operating the above-described cooling device.

DESCRIPTION OF THE PRIOR ART

Water or oil functions as the coolant for direct fluid cooling of the semiconductor component elements in a familiar cooling device of the above-mentioned type (Siemens Magazine 44 (1970), Vol. 1, pages 39 to 43).

In this way the heated coolant fluid can be recooled by means of a forced air ventilation thermal exchange mechanism or by means of a second fluid cycle. Water cooling is more effective than oil cooling; yet even chemically pure water tries to introduce ions from the surrounding substances into the solution so that an exchange of ions is necessary in order to maintain a certain insulating capacity of the water.

When cooling electrical semiconductor elements, for example current director valves, with coolant cycles and forced air ventilated thermal exchange mechanisms, water and oil are commonly used as primary coolants but with certain disadvantage, namely low insulating capacity along with practically unavoidable impurities in water and a reduction in the insulating capacity in conductors outside of the coolant due to the collection of dust at oil leakage sites. Other, essentially suitable coolants would require an inefficient enlargement of the thermal exchange mechanism.

Furthermore, water freezes at below 273 K. In case of any leakage, insulating transformer oil induces the collection of dust and can, therefore, lead to a negative influence on the electrical voltage strength. This danger also exists when silicon oil is used.

SUMMARY OF THE INVENTION

Accordingly, one object of this invention is to provide a novel cooling device of the above-mentioned type in such a way that inert-like fluids, for example derivatives of methane or of ethane in appropriate compounds, can be used as coolants without necessitating an enlargement in the thermal exchange mechanism.

This object is achieved in accordance with the discovery by providing a novel cooling system in which the coolant cycle flows through the vaporizer of a coolant cycle system. Therefore, a portion of the heat can be advantageously derived, as is common, from the forced air ventilated thermal exchange mechanism and the other part from the cooling system.

The invention solves the problems of the prior art by means of a secondary coolant cycle with a vaporizer, through which the primary coolant cycle is channeled, in addition to the forced air ventilated thermal exchange unit. Thereby, a part of the released heat is removed from the thermal exchange unit and the rest is removed by the vaporizer and the secondary coolant cycle. That is when using specially suitable primary coolants such as inert-like fluids, an enlargement of the thermal exchange mechanism can be avoided. For this purpose, the condenser of the secondary cycle is connected to the thermal exchange unit.

Preferably, the condenser of the coolant cycle system is built into the forced air ventilated thermal exchange mechanism of the coolant cycle with which it does not have to work as hard and smaller dimensions of the thermal exchange mechanism are possible.

Another object of the invention is to provide a method for operating the cooling device with which the cooling process can be designed especially efficient.

This object is achieved by using a coolant, the boiling point of which is somewhat lower than the contact temperature of the element to be cooled for the purpose of combined convection and boiling cooling, and channeling a portion of the lost heat to the vaporizer of the cooling system only above a pre-determined surrounding temperature.

The heat is derived primarily by means of convection in the above-described, familiar fluid cooling process. Yet in the selection of coolants, the boiling point of which is somewhat lower than the contact temperature of the element to be cooled, as proposed by the discovery, heat is also derived from boiling along with convection in some areas so that a higher degree of effectivity is achieved.

For this purpose $C_2F_3Cl_3$ is chosen as a coolant. On the basis of the temperature conditions which, for example, exist in the coolant containers that can be used for fluid cooling of electrical semiconductor component elements in accordance to DE-OS No. 26 40 000, essentially a coolant with a boiling point between 328 K. and 333 K. would be desirable. The $C_2F_3Cl_3$ compound (type 113) with a boiling point of 320.6 K. provides the best approximation of this temperature range at the present time. Nevertheless, because of the relatively low boiling point of this compound, the temperature gradient for recooling (liquification) of the coolant is very low. At a surrounding temperature of 313 K., for example, it is only 7.6 K. so that essentially an even larger thermal exchange mechanism would be necessary. On the other hand, when cooling directional current circuits, considerable losses in power of up to a few hundred kW have to be carried off. A cooling system having to process the entire capacity would be too voluminous and would have a very low degree of efficiency. Therefore dividing up the lost power to the forced air ventilated thermal exchange mechanism and the cooling system provides an optimal solution. With this it is possible to construct the thermal exchange mechanism at a size corresponding to purely conventional functioning thermal exchange mechanisms. Furthermore, depending upon the capacity of the cooling system, one is capable of lowering the coolant temperature below that of the surrounding air with which one then can more effectively cool the component elements producing lost heat.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, which is a schematic diagram of the invention.

DESCRIPTION OF THE PRFERRED EMBODIMENTS

Referring now to the drawing, the example therein shown refers to the cooling of a current directer (1). The coolant cycle, when viewed in the direction of the current, includes piping (2), a thermal exchange mechanism (3) attached to a ventilator (4), piping (5), a vaporizer (6), piping (7), a pump (8), and a reverse flow pipe (9) leading, for example, to the cooling containers of the semiconductor component elements of the current directer (1).

The vaporizer (6) is a part of a cooling cycle system which contains (when viewed from the vaporizer (6) in the direction of the current): a compressor (10), a condenser (11), a collecter (12), and an expansion valve (13).

The cooling device funtions in the following way:

The coolant is partially vaporized at the surfaces giving off heat, for example, from the cooling containers of the electrical semiconductor component elements of the current directer (1). The partially gaseous, partially fluid coolant is channeled through the piping (2) to the thermal exchange unit (3) where a larger part of the heat is channeled off to the surroundings by means of convection caused by the fan (4) although no complete liquification of the coolant actually occurs. This occurs only if the coolant flows through the vaporizer (6) of the cooling system through piping (5). The temperature of the coolant can be more or less below its boiling point. Then the coolant is transported again to the current directer for taking on heat through piping (7), the pump (8), and piping (9). The cooling system consists of common parts and functions in a familiar way. For this purpose the condenser (11) is built into the thermal exchange mechanism (3) of the coolant cycle because it can function at higher temperatures. With this practically no ventilator power is saved—only portions of the degree of effectivity—but there are considerable savings in the volume of these parts and in the costs necessary for this.

Advantageously, the coolant cycle can function at relatively low pressures resulting mainly from the losses in flow because the gas pressure of the preferred coolant $C_2F_3Cl$, (Type 113) increases by less than 1 bar at the temperature cited.

The use of coolants, primarily of type 113, for cooling electronic components is an essentially known process (Scientific report of AEG-Telefunken 51 (1978) 1, pages 30–39; Bulletin ASE/UCS 68 (Dec. 17, 1977) 24, pages 1314–1317). From these works it can be seen that because of the low temperature gradients between the surrounding air and the boiling point of the coolant, a coolant water cycle is used. The expanded version, that can then occasion recooling of the water with the surrounding air, is only relevant if the surrounding temperatures are low enough. Yet this explanation is not comprehensible; for if such low temperatures exist, one can recool the coolant with the surrounding air directly as well and thereby work with better degrees of efficiency.

The combination of the thermal exchange unit (3) and a sequentially positioned vaporizer (6), as proposed by the invention, functions with surprising effectivity at a very low degree of complexity.

The cooling device also allows for the removal of the total lost capacity from the thermal exchange unit so that a portion of the lost heat is channeled to the vaporizer of the cooling system only when the surroundings are above a predetermined temperature and then removed from this. One can design the thermal exchange mechanism (3) in correspondance with the mean annual temperature if, at this temperature, a sufficient temperature gradient results for removing the entire lost capacity. As long as the pre-determined surrounding temperature, being somewhat above the mean annual temperature, is not exceeded, then the cooling system can be turned off so that for a large part of the year there can be recooling with a better degree of efficiency.

The cooling system, on the one hand, can be included for cooling the control electronics as well as for cooling the current directer (1) at very hot room temperatures and, on the other hand, it can also be used for air conditioning rooms occupied by human beings.

Finally, the cooling system not only allows for the possible use of a coolant the boiling point of which is somewhat lower than the contact temperature of the component element to be cooled in accordance with the preferred method but rather also for the use of a coolant with a higher boiling point for which the principle of dividing the lost capacity to the thermal exchange unit (3) and the vaporizer (6) is used at surrounding temperatures occurring in all cases.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A cooling system for cooling at least one semiconductor component, comprising:
    a coolant flow circuit connected with said component
    a convection heat exchanger connected in said circuit;
    a refrigeration cycle system thermally coupled to said coolant circuit and including a compressor, a condenser, a collector, an expansion valve, and an evaporator, said evaporator coupled in series with said exchanger in said circuit;
    at least one fan for forcibly ventilating said convection heat exchanger for thereby cooling the at least one semiconductor component;
    said condenser of said refrigeration cycle system installed in said forcibly ventilated convection heat exchanger whereby said at least one fan serves also to cool said condenser; and
    a coolant suitable for combined convection and boiling cooling being used in the coolant circiut, said coolant having a boiling point below the wall temperature of said at least one semiconductor component to be cooled.

2. A cooling system according to claim 1, wherein said coolant comprises:
    trifluortrichlorethane ($C_2F_3Cl_3$).

* * * * *